United States Patent [19]

Jäntti

[11] Patent Number: 5,448,769

[45] Date of Patent: Sep. 5, 1995

[54] METHOD FOR TUNING THE MEDIUM FREQUENCY OF AN RF BANDPASS FILTER BY DETERMINING AND INTERPOLATING IN RELATION TO MEDIUM FREQUENCIES AT AND OFFSETS FROM A NOMINAL CARRIER FREQUENCY

[75] Inventor: Arto Jäntti, Oulu, Finland

[73] Assignee: Nokia Telecommunication OY, Espoo, Finland

[21] Appl. No.: 150,132

[22] PCT Filed: Mar. 30, 1993

[86] PCT No.: PCT/FI93/00128

§ 371 Date: Nov. 30, 1993

§ 102(e) Date: Nov. 30, 1993

[87] PCT Pub. No.: WO93/20616

PCT Pub. Date: Oct. 14, 1993

[30] Foreign Application Priority Data

Mar. 31, 1992 [FI] Finland ............... 921412

[51] Int. Cl.$^6$ ................ H04B 1/04
[52] U.S. Cl. ................ 455/115; 455/125; 455/126; 333/171; 333/174; 375/304; 375/305
[58] Field of Search ........... 455/33.1, 103, 104, 455/115, 120–125, 126, 129; 333/17.1, 174; 375/63, 64; 379/59

[56] References Cited

U.S. PATENT DOCUMENTS

| | | | |
|---|---|---|---|
| 3,715,690 | 2/1973 | Young et al. | 333/17.1 |
| 4,726,071 | 2/1988 | Jachowski | 455/125 |
| 5,034,707 | 7/1991 | Kagström | 455/103 |
| 5,235,294 | 8/1993 | Ishikawa et al. | 333/17.1 |
| 5,274,672 | 12/1993 | Weiss | 375/64 |
| 5,300,904 | 4/1994 | Anderson | 375/63 |

FOREIGN PATENT DOCUMENTS 0494058 7/1992 European Pat. Off. ........ 333/17.1
9004127 8/1992 Sweden.

OTHER PUBLICATIONS

"The Design of a GSM Base-Station Tuneable Combiner" *Microwave Engineering Europe;* Hall et al; Oct. 1992; pp. 57–58, 61–62 and 65.

*Primary Examiner*—Edward F. Urban
*Assistant Examiner*—Andrew Faile
*Attorney, Agent, or Firm*—Cushman Darby & Cushman

[57] ABSTRACT

A method for tuning an RF bandpass filter, especially a combiner filter ($10_1$, $10_2$ ... $10_n$) belonging to a GSM system, in which an RF signal having a certain nominal carrier frequency ($f_c$) is inputted into the RF bandpass filter and a medium frequency of a pass band of the RF bandpass filter is tuned depending on an RF power propagating through the bandpass filter or on an RF power reflected from an input of the bandpass filter. For an easier tuning of the filter and for a tuning accuracy better than before, (a) a carrier is modulated by a signal causing a first predetermined offset ($+\Delta f$), of the carrier frequency, (b) a medium frequency, at which the power propagating through the filter is at the maximum or the power reflected from the input of the filter is at the minimum, is searched for for the bandpass filter, (c) the first medium frequency obtained at stage (b) is stored, (d) the carrier is modulated by a signal causing a second predetermined offset ($-\Delta f$) of the carrier frequency, (e) a medium frequency, at which the power propagating through the filter is at the maximum or the power reflected from the input of the filter is at the minimum, is searched for for the bandpass filter, (f) the second medium frequency obtained at stage (e) is stored, and (g) the filter is tuned by tuning its medium frequency to a value determined on the basis of the frequency values obtained at stages (c) and (f).

4 Claims, 2 Drawing Sheets

5,448,769

METHOD FOR TUNING THE MEDIUM FREQUENCY OF AN RF BANDPASS FILTER BY DETERMINING AND INTERPOLATING IN RELATION TO MEDIUM FREQUENCIES AT AND OFFSETS FROM A NOMINAL CARRIER FREQUENCY

BACKGROUND OF THE INVENTION

The invention relates to methods for tuning an RF bandpass filter.

The methods according to the invention are intended to be used especially for tuning so-called combiner filters of a GSM system or a similar mobile phone network, but they can also be applied to bandpass filters suitable for other purposes, the frequency control of which filters requires a power measurement at selective frequency.

A combiner is a device by means of which many transmitters are connected to the same antenna or antenna line. Each radio transmitter is then connected to an antenna or antennae line via a separate bandpass filter, a so-called combiner filter. The medium frequency of each bandpass filter is tuned to the medium frequency of the respective radio transmitter. The object of the filters is, on the one hand, to input a transmission signal of a separate radio transmitter into the antenna at losses as low as possible and, on the other hand, to prevent as effectively as possible an entrance of transmission signals at different frequencies from the other radio transmitters into this separate radio transmitter from the antenna direction. Traditionally, combined filters have been tuned fixedly to the transmission frequencies of the respective radio transmitters. In such instances, it has not been possible to change the transmission frequency of a radio transmitter without changing the combiner filter or the tuning thereof at the same time.

However, it is often desirable to be able to change the frequencies of radio transmitters in a simple and quick manner. One such case is a base station of a cellular mobile phone system, for instance, with particular transmission and reception channels allocated for that base station. If the channel allocation of the system can be changed when required by changing the transmission and reception frequencies of the base stations, it is possible to utilize the channel capacity of the system flexibly and effectively under changing circumstances. For this reason, automatically tuned combiner filters have been developed, the medium frequency of which is automatically changed when the transmission frequency changes.

The tuning of these automatically tuned combiner filters is based on a measurement of RF power reflected from input of the filters or RF power passing through the combiner filters. The medium frequency of the filter is locked at a frequency at which the reflected power is at the minimum or the propagating power at the maximum.

In GSM and PCN mobile phone networks, a socalled GMSK (Gaussian Minimum Shift Keying) modulation serves as a method of modulating a transmitter signal. This modulation method is a relatively broadband one for signals corresponding to practical conditions, as a result of which it is difficult to tune the associated combiner filters each to a correct frequency and the tuning accuracy achieved remains rather modest.

SUMMARY OF THE INVENTION

The object of the present invention is thus to provide a method by means of which combiner filters can be tuned each to a correct frequency more accurately than previously.

Practicing the invention involves searching for a bandpass filter for a medium frequency, at which the power propagating through the filter is at the maximum or the power reflected from the input of the filter is at the minimum, at least twice by using in each case a modulation signal which provides the spectrum of the signal to be obtained as a result of the modulation with a sharp peak (a carrier) at a predetermined frequency, and determining the final frequency on the basis of at least two tuning values obtained from the tunings carried out on grounds of these RF signals.

By means of the solution of the invention, an RF bandpass filter can be tuned to a correct frequency in an easier and more accurate way than was previously obtained.

BRIEF DESCRIPTION OF THE INVENTION

In the following, the invention and the preferred embodiments thereof are explained in more detail with reference to the examples according to the attached drawings, in which:

FIG. 1 shows a block diagram of a typical transmitter system implemented by combiner filters, in which system a medium frequency of a passband of a bandpass filter (combiner filter) is tuned depending on the RF power propagating through the filter, FIG. 2 shows a block diagram of a typical transmitter system implemented by combiner filters, in which system a medium frequency of a passband of a bandpass filter (combined filter) is tuned depending on the RF power reflected from an input of the filter, FIG. 3 shows a block diagram of a GMSK modulator known per se, which is used in the transmitters illustrated in FIG. 1 and 2, FIG. 4a shows a typical spectrum of a GMSK modulation, FIG. 4b shows a spectrum of a first signal to be used in a method according to the invention, and FIG. 4c shows a spectrum of a second signal to be used in the method according to the invention.

DETAILED DESCRIPTION

Figure 1:
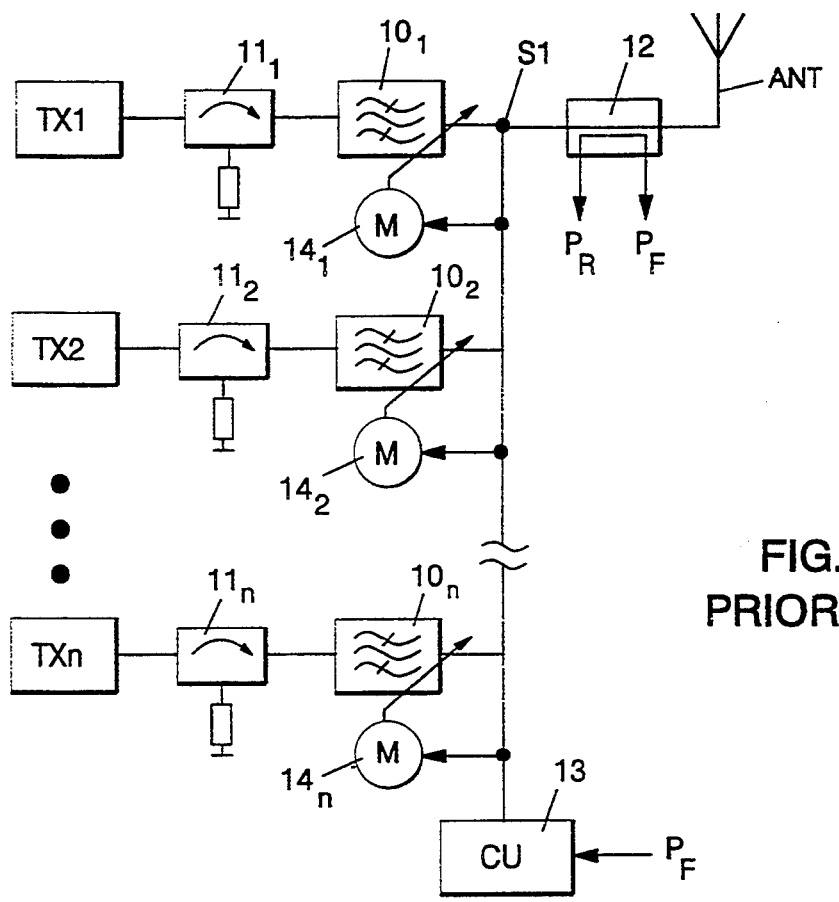

FIG. 1 shows a radio transmitter system belonging to a GSM mobile phone network or the like, which system comprises n radio transmitters TX1, TX2 ... TXn having respective transmission frequencies f1, f2 ... fn situated within the range of 920 to 960 MHz, for instance. Each radio transmitter is connected via bandpass filters $10_1$, $10_2$ ... $10_n$ tuned to respective frequencies to a common summing point S1, and further via a directional coupling means 12 to a common transmitting antenna ANT. (A connection of each transmitter to the corresponding bandpass filter occurs in this example via a circulator $11_1$, $11_2$ and $11_n$, respectively. However, circulators are not necessary components of apparatus for practicing the method of the invention.) Consequently, the signal to be inputted into the transmitting antenna ANT includes the frequencies of all of the transmitters. The bandpass filters $10_1$, $10_2$ ... $10_n$ shown in FIG. 1 and connecting several transmitters to the common antenna are generally called combined filters.

The radio transmitter system additionally comprises a control unit 13 controlling a stepper motor $14_1$, $14_2$ and $14_n$, respectively, belonging to each combiner filter, each stepper motor tuning a medium frequency of the respective combiner filter. Each filter is a narrowband filter, the medium frequency of which in normal intended use is intended to be tuned as close as possible to the frequency of a transmission carrier so that the signal to be transmitted moves to the antenna ANT at losses as low as possible. In the example of FIG. 1, the medium frequency is tuned in a manner known per se depending on the RF power propagating through the bandpass filter. By means of the directional coupler 12, a sample signal $P_F$ is taken of an output signal of each filter separately, which sample signal is proportional to the signal power at transmission frequency passed through the respective filter. The sample signal is inputted into the control unit 13, which tunes the medium frequency of the filter by means of the stepper motor in such a way that the level of the sample signal is at the maximum.

Figure 2:
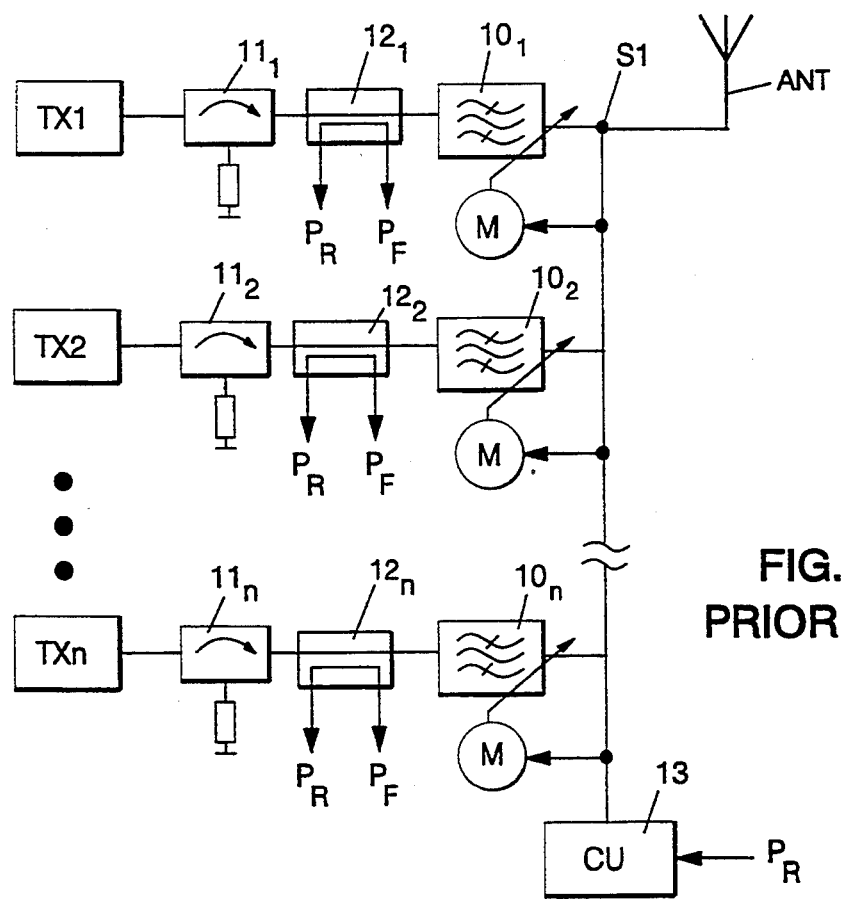

The example of FIG. 2 corresponds to the embodiment of FIG. 1, except that each combiner filter $10_1$... $10_n$ now is tuned in another manner known per se, i.e., depending on the RF power reflected from an input of a combined filter. For this reason, the antenna line has no directional coupler. However, to each transmitter branch, to the input of the respective combiner filter, is connected a separate directional coupling means $12_1$, $12_2$ and $12_n$, respectively. In this case, a sample signal $P_R$ is taken of a signal component reflected from the input of the filter by each directional coupler, which sample signal is proportional to the power of the signal component and inputted into the control unit 13. By means of each stepper motor, the control unit 13 tunes the medium frequency of the respective filter in such a way that the level of the sample signal is at the minimum.

Above have been described the two known ways of tuning a combiner filter on which the method of the invention is based. The stages of the method according to the invention will be explained in more detail in the following.

Figure 3:
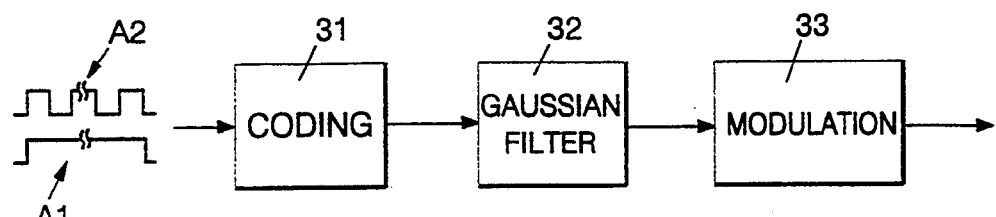

FIG. 3 shows a block diagram of a GMSK modulator known per se and belonging to the transmitters TX1... TXn and FIG. 4a in turn a typical signal spectrum S1 obtained as a result of a GMSK modulation. The GMSK modulator comprises a coding unit 31, a Gaussian filter 32, to which the output of the coding unit is connected, and a modulation unit 33, to which the output of the filter is connected. In the coding unit, a differential coding of incoming data is performed, the coded signal is filtered in the Gaussian filter 32 and the filtered signal is modulated to carrier frequency in the modulation unit 33. Because the structure of the GMSK modulator is known per se and does not relate to the novelty or non-obviousness of the present invention, it is not described more accurately in this connection. The operation of the modulator appears in greater detail e.g. from the paragraphs 2.4 to 2.6 of the GSM specification 05.04 (version 3.1.1).

Figure 4A:
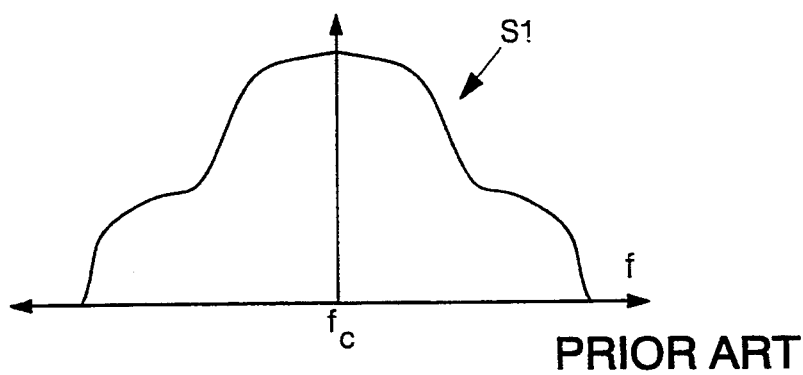

The spectrum S1 of an RF signal to be obtained from the output of the modulation unit 33 and to be inputted into a combiner filter is typically similar to the spectrum shown in FIG. 4a, i.e. relatively broad. Data to be transferred in a practical situation or random data reminding of the data to be transferred in a practical situation have served as modulating data.

However, a property of GMSK modulation is that the spectrum of the signal to be obtained as a result of modulation is provided with a sharp peak (i.e., a carrier) at a predetermined frequency deviating from the actual nominal carrier frequency $f_c$ (wherein $f_c$ is f1, f2, etc., or fn), when a particular predetermined bit queue is used as modulating data. In other words, the carrier occurs as a sharp peak at a frequency which has been offset a predetermined distance from the nominal carrier frequency. For instance, when a bit queue 11111 ... is used, the spectrum peak is offset about $+(\frac{1}{4}T)$ from the nominal carrier frequency, 1/T being the transmission rate to be used (in a GSM system, the transmission rate is 270,833 kbit/s). Correspondingly, when a bit queue 010101 ... is used, the spectrum peak is offset about $-(\frac{1}{4}T)$ from the nominal carrier frequency.

Figure 4B:
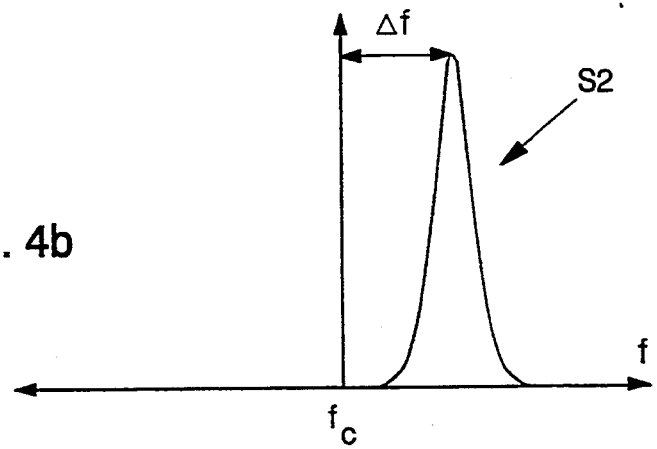

According to the invention, this property is utilized at the tuning of combiner filters in such a way that the carrier is at first modulated e.g., by the bit queue 1111 ... indicated by reference mark A1 in FIG. 3. Then a spectrum S2 of an RF signal to be obtained from the modulation unit 33 to the input of a combiner filter is similar to the spectrum shown in FIG. 4b. The spectrum now comprises a sharp peak (a carrier) at a frequency which has been offset about $+\Delta f$ ($\Delta f = \frac{1}{4}T$) from the nominal carrier frequency $f_c$. By using this signal, a medium frequency, at which the power propagating through the filter is at the maximum or the power reflected from the input of the filter is at the minimum, is searched for for the combiner filter, i.e., either the method illustrated in FIG. 1 or the method illustrated in FIG. 2 is used. The first information of a medium frequency obtained in this way is stored.

Figure 4C:
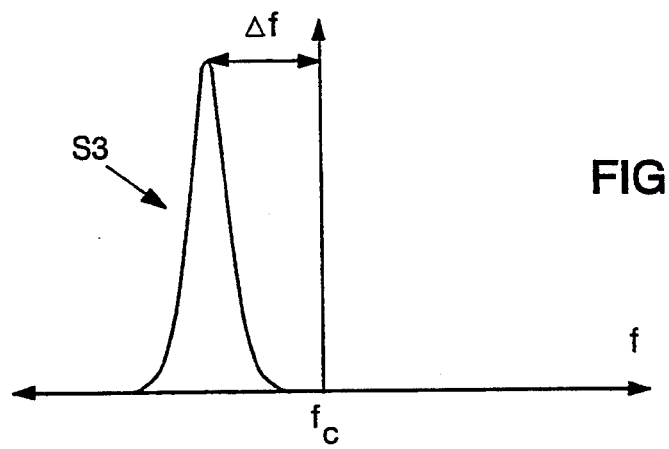

At the following stage, the carrier is modulated, for instance by the bit queue 010101 ... indicated by reference mark A2 in FIG. 3. The spectrum S3 of the RF signal obtained from the modulation unit to the input of a combiner filter is then similar to the spectrum shown in FIG. 4c. The spectrum has now a sharp peak (a carrier) at a frequency which has been offset about $-\Delta f$ ($\Delta f = \frac{1}{4}T$) from the nominal carrier frequency $f_c$. (In practice, the spectrums S1 and S2 to be obtained as a result of modulation comprise weaker components at other frequencies, too, but for the sake of clarity, they are not shown in the FIGS. 4b and 4c). By using this second signal, a medium frequency, at which the power propagating through the filter is at the maximum or the power reflected from the input of the filter is at the minimum, is again searched for for the combiner filter. In other words, either the method illustrated in FIG. 1 or the method illustrated in FIG. 2 is reused. The second information of a medium frequency obtained in this way is stored.

The last stage is the final tuning of the combiner filter by tuning the medium frequency midway between the first and the second medium frequency information.

Though the invention has been described above with reference to the examples of the attached drawings, it is clear that the invention is not restricted to it. Accordingly, even if the invention has been explained referring to a combiner filter belonging to a GSM system, for instance, the invention can also be applied to other systems using GMSK modulation, or to other modulation methods having the properties which have been disclosed. In principle, the method can also be implemented in such a way that the first and second offsets of the carrier frequency have unequal absolute values. In the above examples, this means that different transmission rates are used at the respective stages of the method. Moreover, the methods can be combined, which means that a measurement of both the reflected RF power and the RF power passed through are used for tuning in such a manner that the control unit each time selects the way of tuning depending on external load. Because different load situations affect the sample signals $P_F$ and $P_R$ in different ways, this combined tuning method can reduce the influence of these external loads on the tuning.

We claim:

1. A method for tuning a medium frequency of a pass band of an RF bandpass filter depending on RF power propagating through the filter, comprising:
   (a) modulating a carrier being inputted into the filter, by a signal causing a first predetermined offset of the carrier frequency in one direction from a nominal frequency thereof;
   (b) searching for a first medium frequency, at which RF power propagating through the filter during step (a) is at the maximum for the bandpass filter;
   (c) storing the first medium frequency obtained in step (b);
   (d) modulating the carrier being inputted into the filter by a signal causing a second predetermined offset of the carrier frequency in an opposite direction relative to said one direction from the nominal frequency thereof;
   (e) searching for a second medium frequency, at which RF power propagating through the filter during step (d) is at the maximum for the bandpass filter;
   (f) storing the second medium frequency obtained in step (e); and
   (g) tuning the medium frequency of the filter to a value having a predetermined relationship to the first and second medium frequencies respectively obtained in steps (c) and (f).

2. A method according to claim 1, wherein:
   in steps (a) and (d), the carrier is modulated by signals causing substantially equal offsets of the carrier frequency, but in opposite directions; and
   in step (g) the filter is tuned so that the medium frequency thereof has a value which is midway between the first and second medium frequencies respectively obtained in steps (c) and (d).

3. A method for tuning a medium frequency of a pass band of an RF bandpass filter depending on RF power reflected from an input of the filter, comprising:
   (a) modulating a carrier being inputted into the filter at an input thereof, by a signal causing a first predetermined offset of the carrier frequency in one direction;
   (b) searching for a first medium frequency, at which RF power reflected from the input of the filter during step (a) is at the minimum for the bandpass filter;
   (c) storing the first medium frequency obtained in step (b);
   (d) modulating the carrier being inputted into the filter at an input thereof by a signal causing a second predetermined offset of the carrier frequency in an opposite direction relative to said one direction;
   (e) searching for a second medium frequency, at which RF power reflected from the input of the filter during step (d) is at the minimum for the bandpass filter;
   (f) storing the second medium frequency obtained in step (e); and
   (g) tuning the medium frequency of the filter to a value having a predetermined relationship to the first and second medium frequencies respectively obtained in steps (c) and (f).

4. A method according to claim 3, wherein:
   in steps (a) and (d), the carrier is modulated by signals causing substantially equal offsets of the carrier frequency, but in opposite directions; and
   in step (g) the filter is tuned so that the medium frequency thereof has a value which is midway between the first and second medium frequencies respectively obtained in steps (c) and (d).

* * * * *